United States Patent
Steensgaard-Madsen

(10) Patent No.: US 8,130,133 B2
(45) Date of Patent: Mar. 6, 2012

(54) A/D CONVERTER USING ISOLATION SWITCHES

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 48 days.

(21) Appl. No.: 12/844,727

(22) Filed: Jul. 27, 2010

(65) Prior Publication Data

US 2012/0026027 A1 Feb. 2, 2012

(51) Int. Cl.
*H03M 1/12* (2006.01)

(52) U.S. Cl. ........................ 341/172; 341/161
(58) Field of Classification Search .............. 341/163, 341/172
See application file for complete search history.

(56) References Cited

U.S. PATENT DOCUMENTS

| | | | |
|---|---|---|---|
| 4,641,130 A | | 2/1987 | Mastroianni |
| 4,831,381 A | * | 5/1989 | Hester ........................ 341/172 |
| 6,087,970 A | * | 7/2000 | Panicacci ..................... 341/172 |
| 6,667,707 B2 | * | 12/2003 | Mueck et al. ................. 341/172 |
| 6,940,445 B2 | | 9/2005 | Kearney |
| 7,741,981 B1 | * | 6/2010 | Wan et al. .................... 341/110 |
| 7,880,659 B2 | * | 2/2011 | Lee ............................. 341/161 |

OTHER PUBLICATIONS

James L. McCreary et al., All-MOS Charge Redistribution Analog-to-Digital Conversion Techniques—Part I, IEEE Journal of Solid-State Circuits, vol. SC-10, No. 6, Dec. 1975, pp. 371-379.

\* cited by examiner

*Primary Examiner* — Khai M Nguyen
(74) *Attorney, Agent, or Firm* — Patent Law Group LLP; Brian D. Ogonowsky

(57) ABSTRACT

In an A/D converter, isolation switches are used between the capacitors and the conversion switches. The conversion switches are those switches used to selectively couple the plates of the binary weighted capacitors to either Vref or 0 volts during the A/D conversion process. During sampling of the input voltage signal, the isolation switches are opened to isolate the conversion switches from the wide range of possible input voltages at the bottom plates of the capacitors. Therefore, the voltage across the conversion switches is substantially limited to Vref. Hence, the conversion switches can be very fast low voltage switches. After sampling of the input voltage, when the sampled input voltage is locked in, the conversion switches operate normally to selectively connect the capacitor plates to either Vref or 0 volts for successively approximating the input voltage, whereby a digital code representing the sampled input voltage is generated.

20 Claims, 3 Drawing Sheets

A/D CONVERTER USING ISOLATION SWITCHES

FIELD OF THE INVENTION

This invention relates to analog-to-digital (A/D) converters and, in particular, to isolation switches in an A/D converter for isolating high input voltages from low voltage circuitry.

BACKGROUND

In a successive approximation register (SAR) A/D converter, capacitors in an array are charged to the instantaneous value (voltage) of an analog input voltage signal (Vin) by operation of sampling switches. To complete a sampling operation, whereby a sampled voltage corresponding to the instantaneous value of the input voltage signal at a sampling instance is locked in, the sampling switches are opened. During a subsequent A/D conversion operation, the converter successively performs a series of bit tests, wherein conversion switches connected to the capacitors are controlled to effectively generate a series of comparison voltages that are compared to the sampled voltage to determine whether the sampled voltage is higher or lower than each generated comparison voltage. The series of generated comparison voltages successively narrows in on the sampled voltage, whereby a digital representation of the sampled voltage is derived. Typically, a starting value for each series of comparison voltages is at the middle of a full-scale input voltage range. If the sampled voltage is detected as being higher than this initial first comparison voltage, the first (most significant) bit of the digital representation is set to a one, and the second value in the series of comparison voltages is selected halfway between the initial comparison voltage and the upper limit of the input voltage range. If the sampled voltage is determined to be lower than this second comparison voltage, the second bit of the digital representation is set to a zero, and the third value in the series of comparison voltages is selected as halfway between the first and second values in the series of comparison voltages for setting the third bit in the digital representation. By repeating such an operation for each bit, the digital code being generated to represent the sampled value of the analog input voltage signal can be made to have any resolution.

Each switch for the A/D converter must be designed to handle the voltages that may appear at the device terminals during the sampling and the conversion operations. In the case of a SAR A/D converter, some conversion transistors may be subject to the difference between a positive reference voltage (Vref) and the lowest Vin, where the lowest Vin may be a negative voltage. Therefore, prior art SAR A/D converters have been realized using conversion transistors that have a reliability voltage limit (no breakdown) that exceeds the width of a full-scale input voltage range.

Transistors that are fabricated to withstand higher voltages (having higher reliability voltage limits) are generally slower or larger than lower voltage transistors. For example, the doping levels in higher voltage transistors are generally lowered to withstand higher voltages, and the doped regions are made larger. This increases on-resistance unless the transistor gates are made wider.

A/D converters preferably perform very rapid sampling and conversion operations. Therefore, there is a tradeoff between switching speed, size, and the requirement of the switches to handle the worst-case voltages.

FIG. 1 illustrates one type of prior art SAR A/D converter. A similar converter is described in U.S. Pat. No. 6,940,445, incorporated herein by reference for describing in detail the structure and operation of a converter that has a programmable input voltage range, where some of the full-scale input voltage ranges may extend above and/or below a reference voltage range (delimited by a low reference voltage potential and a high reference voltage potential). Circuitry for only three bits of resolution is shown explicitly in FIG. 1, although actual A/D converter implementations typically have much higher resolutions (say, 8, 12, 16, or 18 bits of resolution).

In FIG. 1, an analog input voltage signal Vin is to be sampled at a particular instant in time, and the sampled value is to be converted into a corresponding digital code. The maximum value of the digital code (all ones) corresponds to a maximum analog voltage, delimiting a full-scale input voltage range. The upper limit of the full-scale input voltage range may (but need not) equal the upper reference potential Vref. The minimum value of the digital code (all zeroes) corresponds to a minimum analog voltage, delimiting the full-scale input voltage range. The lower limit of the full-scale input voltage range may (but need not) equal the lower reference potential, 0 Volts. In the case where the upper and lower limits of the full-scale input voltage range are substantially equal to the upper and lower reference voltage potentials, there is no need to scale down the input voltage to the dynamic range of the converter. In such a case, the A/D converter of FIG. 1 successively compares the sampled voltage to different fractions of Vref and generates a digital code that substantially represents the ratio of the sampled voltage to Vref.

While Vin is being tracked prior to the sampling instance, sampling switches S1-S4 are on (closed), and conversion switches S5-S7 are off (open). Switches S5-S7 are three-way switches that are either off (open) or connecting the bottom plates of capacitors 2-4 to either the low reference potential or the high reference potential. The voltage across the binary weighted capacitors 2-4 (plus other capacitors not shown) therefore tracks the analog input voltage signal Vin. The capacitors 2-4 (and others not shown) are binary weighted having the values C/2, C/4, C/8, etc., respectively, where C is a predefined total capacitance quantity. Other types of capacitor arrays are known for a SAR A/D converter.

To complete a sampling operation, switches S1-S4 are opened to lock in a sampled voltage across capacitors 2-4 corresponding to the instantaneous value of the input voltage signal Vin at the sampling instance.

A SAR conversion engine and switch controller 5 (hereinafter controller 5) contains a successive approximation register (SAR) with an n-bit code that is updated at the end of each bit-test cycle. During each bit-test cycle, the sampled voltage is effectively compared to a comparison voltage corresponding to the n-bit code stored in the SAR. A first (most significant) bit is determined in the first bit-test cycle, which indicates whether the sampled voltage is above or below the first comparison voltage Vref/2. The controller 5 applies the individual comparison voltages, by controlling the conversion switches S5-S7 (and others not shown), to selectively couple the bottom plates of the capacitors to either the high reference potential (Vref) or the low reference potential (0 volts). Each capacitor corresponds to (is controlled according to) one corresponding bit in the SAR. The switching of the capacitors by the controller 5 redistributes the charges on the capacitor plates. For example, if the C/2 capacitor 2 is connected to the high reference voltage potential (Vref), and all the other capacitors are connected to the low reference potential (0 volts), then the voltage VX at the non-inverting input of the comparator 6 will substantially equal Vref/2-Vin. If VX is less than 0 volts, it is known that the sampled voltage is above Vref/2, and the first bit of the n-bit code in the SAR is set to one until the end of the conversion cycle. In each bit-test cycle, the polarity of VX is the same as the polarity of the comparison voltage being evaluated less the sampled voltage. The comparator 6 detects the polarity of VX, and the n bits in the SAR are determined sequentially one bit per bit-test cycle. The conversion process continues for all the binary weighted capacitors (each being controlled by one bit in the SAR) until the least significant bit has been determined, at which point the n-bit code in the SAR is the resulting digital code corresponding to the sampled value of the input voltage signal.

The controlling of the capacitors by a digital code creates a digital to analog converter (D/A converter, or DAC), within the A/D converter, whose output is successively compared to the sampled input voltage. There may be any number of capacitors in the DAC depending on the desired resolution. Many variations of the D/A converter implementation (e.g., segmentation) and the successive-approximation algorithm are known by those skilled in the art.

The converter of FIG. 1 can also be configured to receive and process (sample and convert to digital codes) input voltage signals greater than Vref. This is done by controlling the switches S1-S7 to sample the input voltage on only a predefined ratio of the capacitors and to couple the remainder of the capacitors to 0 volts during sampling. As a result, some capacitors will be charged to Vin and other capacitors will be charged to 0 volts at the sampling instance. The conversion operation is carried out as described previously. The polarity of voltage VX at the non-inverting terminal of comparator 6 now reflects the polarity of the comparison voltages designated in the SAR less a fraction (the predefined ratio smaller than one) of the sampled input voltage signal. Therefore, the sampled input voltage is effectively attenuated by the predefined ratio of the plate area sampling Vin to the plate area sampling 0 volts. The full-scale input voltage range that corresponds to this mode of operation is characterized by (delimited by) the input voltage levels that result in the maximum and minimum digital codes being produced by the conversion operation. Accordingly, the ADC can process input voltage signals with respect to full-scale input voltage ranges that exceed the reference voltage range.

Similarly, the ADC can be configured so that the full-scale input voltage range extends below the lower limit of the reference voltage range. This is accomplished by coupling the C/2 capacitor 2 to the high reference potential Vref during sampling, coupling the C/4 capacitor 3 to Vin during sampling, and coupling the remaining capacitors to the low reference potential, 0 volts, during sampling. The conversion operation is carried out as described previously. The polarity of voltage VX at the non-inverting terminal of comparator 6 now reflects the polarity of the comparison voltages designated in the SAR less a predetermined fraction of sampled input voltage signal plus a predetermined offset (or level-shift). The full-scale input voltage range that corresponds to this mode of operation is characterized by the input voltage levels that result in the maximum and minimum digital codes being produced by the conversion operation. Accordingly, the ADC can process input voltage signals with respect to full-scale input voltage ranges that extends above and/or below the limits of the reference voltage range. Such scaling is further described in U.S. Pat. No. 6,940,445, incorporated herein by reference.

In all cases, after sampling, the input voltage terminal is decoupled from the capacitors and the bottom plates of the capacitors are selectively biased at 0 volts or Vref during the conversion process to successively derive the digital code corresponding to the sampled input voltage with respect to the pertinent full-scale input range.

In the case where the input voltage signal Vin is between 0-Vref, the maximum voltage across the switches S5-S7 is Vref, and the reliability voltage limits for switches S5-S7 need only meet this relatively modest requirement. If the range of Vin extended below 0 volts or above Vref, then greater voltages will appear across switches S5-S7 and the reliability limits of these switches S5-S7 must meet the associated increased requirements. As an example, a SAR ADC may be designed to operate with an upper reference voltage potential Vref of 5 volts. The SAR ADC may be configured and operate with a full-scale analog input voltage range from −10 volts to +10 volts. Therefore, the conversion switches (e.g., switches S5-S7 in FIG. 1) must have reliability voltage limits that allow voltages of at least 15V to appear across the terminals of switches S5-S7 during the sampling operation.

Transistor switches, such as MOSFET switches, that can handle higher voltages are generally slower and larger than lower voltage transistors. For some applications, sampling rates greater than one million conversion cycles per second are required, and each conversion cycle requires many bit-test cycles (each switching one of the conversion switches S5-S7) to generate the digital code. It is desirable that the conversion switches can be switched very fast to quickly generate the n-bit digital code representing the sampled value of the input voltage signal.

There are many variations of SAR A/D converters, some more complex than those described above, but the basic principle is the same.

FIG. 2 illustrates a differential SAR A/D converter, where the analog input voltage is a differential signal between Vinp (positive) and Vinn (negative). The average value of Vinp and Vinn (Vinp/2+Vinn/2) may be referred to as the common-mode voltage, which nominally is substantially constant. The difference between Vinp and Vinn may be referred to as the differential voltage (Vinp-Vinn), which is to be sampled and digitized. Each input terminal (Vinp and Vinn) has its own set of binary weighted capacitors C/2-C/64 for a 6-bit A/D converter. The sampling switches S, 9, and 10 are closed during the sampling operation until the sampling instance when these switches are opened. Conversion switches 11 and 12 are open during the sampling operation. The full-scale input voltage range can be changed/selected by modifying the operation of switches S, 9, 10, 11, and 12 during the sampling operation as described with respect to FIG. 1 (so that a certain ratio of the capacitors sample the input voltage signal and the other capacitors sample the reference potentials). During the conversion operation, a controller controls switches 11 and 12 to effectively generate a series of comparison voltages according to the contents of a SAR register. Comparator 13 evaluates each comparison voltage with respect to the sampled (and potentially scaled and offset) value of the input voltage signal in the same manner as described above. Further detail regarding the operation of a differential SAR A/D converter is provided in U.S. Pat. No. 6,667,707, incorporated herein by reference. The conversion switches 11 and 12 in FIG. 2, similar to those in FIG. 1, must be able to withstand relatively large voltages during the sampling operation if the input voltage signal exceeds the reference voltage range (e.g. if Vinp and Vinn swing in the range from −10 volts to +10 volts).

The inherent problems (lower speed, larger size, etc.) associated with conversion switches designed to tolerate high voltages (higher than Vref) applies to many types of A/D converters (including, but not limited to SAR A/D converters) as well as a wide range of signal-processing applications (e.g., switched-capacitor amplifiers and filters).

What is needed is a method and circuits, such as a SAR A/D converter, that allow for fast operation when processing an input signal that may exceed a voltage range (such as a reference voltage range) that is used to represent and process the signal after sampling.

SUMMARY

In an A/D converter, isolation switches are used between the capacitors and the conversion switches. The conversion switches are those switches used to selectively couple the plates of the binary weighted capacitors to a plurality of reference voltage potentials (e.g., 0 volts and 5 volts) during the A/D conversion process. A low reference voltage potential other than 0 volts may be used. During sampling of the analog input voltage signal, the isolation switches are opened to isolate the conversion switches from the input voltage signal (that may exceed the reference voltage range) applied to one or more of the bottom plates of the capacitors. The conversion switches connect one side of the isolation switches to a reference voltage potential, thus limiting the voltage that may appear across the conversion switches. Hence, the conversion switches can be very fast low voltage switches.

After the sampling operation, when the sampled value of the input voltage signal is locked in, the conversion switches operate normally to selectively connect the capacitor plates to the reference voltage potentials (e.g., Vref and 0 volts) for generating a series of comparison voltages successively approximating the sampled input voltage, whereby a digital code representing the sampled input voltage is generated. The isolation switches are closed at the beginning of the conversion operation, and remain closed until the digital code has been generated.

The full-scale input voltage range of the A/D converter can be made programmable by, during the sampling operation, sampling the input voltage signal on a programmable ratio of the capacitors, and sampling one or more reference potentials on the capacitors not used to sample the input voltage signal. In such a case, isolation switches may be incorporated only for those capacitors that are used to sample the input voltage signal. An isolation switch may be connected to a capacitor that is used to sample the input voltage signal when a first full-scale range is selected, and used to sample a reference potential when a second full-scale range is selected. Such an isolation switch is configured to be open during the sampling operation when the first full-scale range is selected and closed when the second full-scale range is selected. An isolation switch need not be incorporated for a capacitor that is used to sample a reference potential for all selectable full-scale input ranges.

In one example, a full-scale input voltage range is from −10 volts to +10 volts, and Vref is 5 volts. Although the bottom capacitor plates may swing between −10 volts and +10 volts, these levels are isolated from the conversion switches by the open isolation switches during sampling, so the conversion switches may be 5 volt types rather than 15 volt types.

Accordingly, the sampling switches (connected to the input terminal Vin) and the isolation switches may be high voltage switches, such as having a reliability voltage limit substantially greater than 5 volts, while the conversion switches, which preferably should switch very fast, may be low voltage switches, such as having reliability voltage limits substantially allowing for only 5-volt operation. The sampling switches and isolation switches do not need to be very fast since they only operate once per A/D conversion cycle.

In one embodiment, the isolation switches must withstand the worst case voltage of −Vin(max) at one terminal and +Vref at another terminal. In one embodiment, each isolation switch comprises two back-to-back NMOS transistors with their sources connected together and their gates connected together. Their drains are the two switch terminals of the isolation switch. The NMOS transistors are asymmetrical, having a gate/drain breakdown voltage higher than a gate/source breakdown voltage. The NMOS transistors are bootstrapped so that the gate/source voltage is limited to the bootstrap voltage.

There may be any number of isolation switches and sampling switches, including only one of each, depending on the particular A/D converter.

The method and circuit techniques of incorporating isolation switches can also be used for sampling higher-voltage signals in a wide range of signal-processing circuits, including switched capacitor amplifier and filtering circuits.

BRIEF DESCRIPTION OF THE DRAWINGS

Elements that are the same or equivalent are labeled with the same numeral.

DETAILED DESCRIPTION

Figure 1:
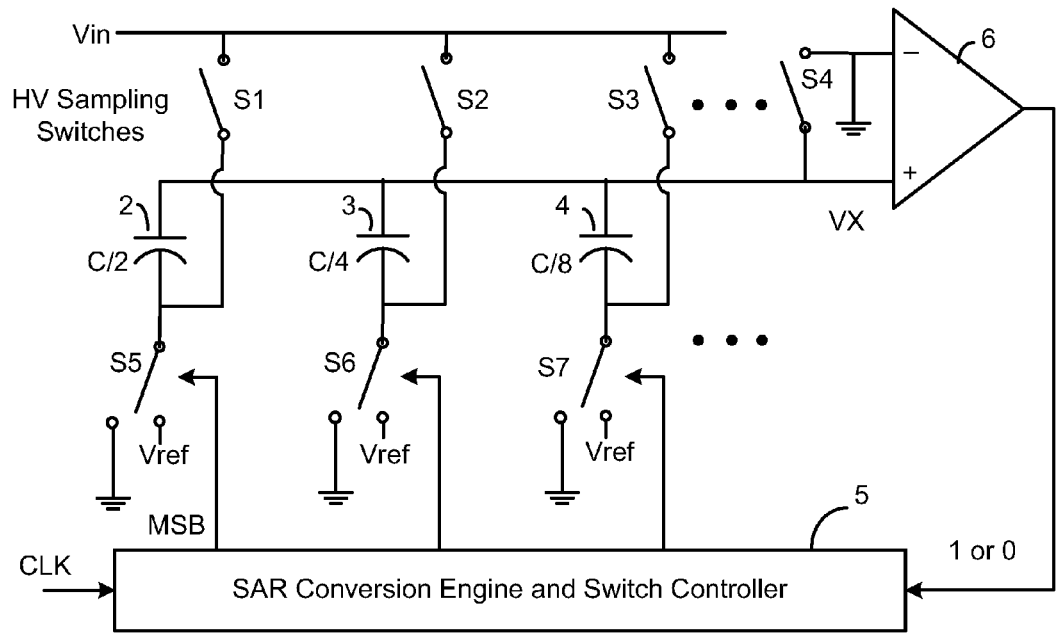
FIG. 1 illustrates one type of prior art SAR A/D converter.
Figure 3:
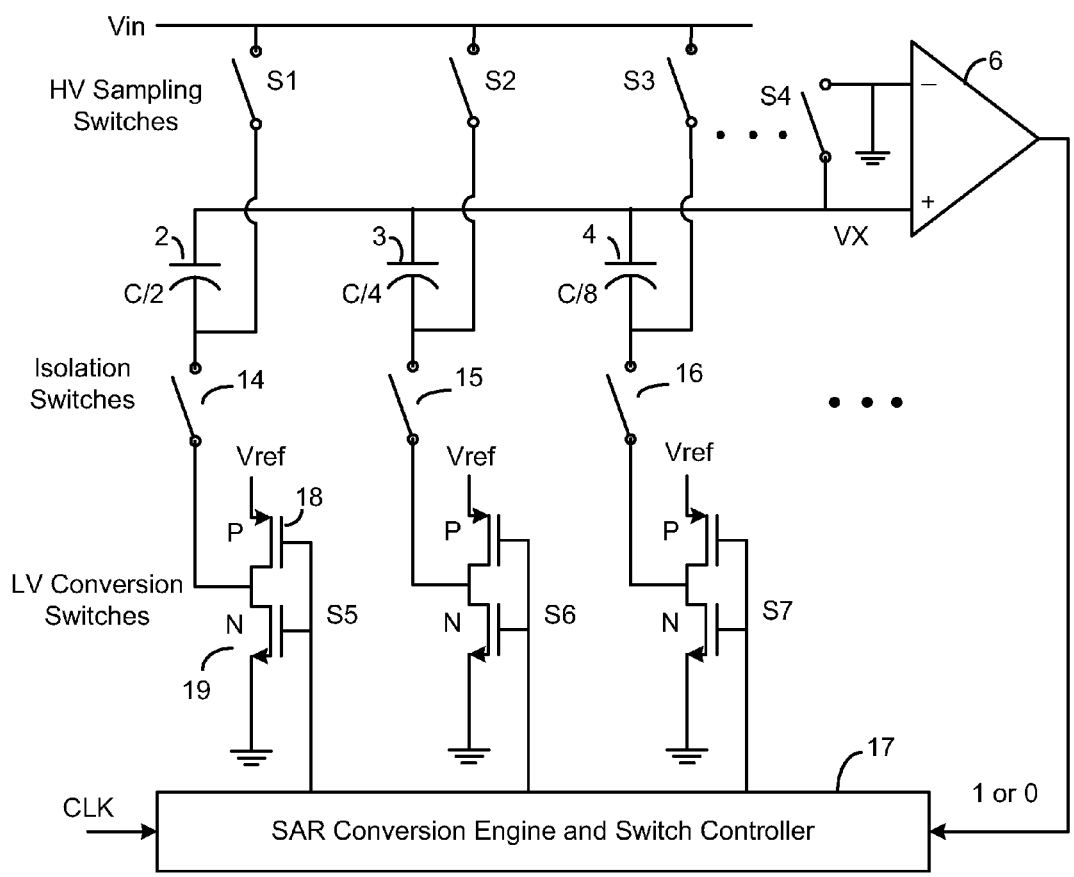
FIG. 3 illustrates the use of isolation switches in a programmable SAR A/D converter to allow the conversion switches to have a reliability voltage limit of Vref, even if the input voltage may be greater than Vref or be negative, in accordance with one embodiment of the invention.

FIG. 3 illustrates the converter of FIG. 1 modified to include isolation switches 14, 15, and 16. In one embodiment, there is an isolation switch for each capacitor and conversion switch controlled by a controller 17, and the converter is programmable to operate with a plurality of full-scale input voltage ranges, such as ±10 volts, 0 to +10 volts, ±5 volts, and 0 to +5 volts. In another type of converter, the converter is hardwired for a particular full-scale input voltage range, and isolation switches are only used for capacitors that are connected to Vin during sampling.

All switches are controlled by the SAR conversion engine and switch controller 17 (hereinafter controller 17).

The conversion switches S5, S6, and S7 are represented by fast inverters, each comprising a PMOS transistor 18 and an NMOS transistor 19. A source of the PMOS transistor 18 is connected to a high reference voltage potential (Vref), and the source of the NMOS transistor 19 is connected to a low reference voltage potential (ground, 0 volts). The gate voltage applied to the transistors 18 and 19 is either 0 volts or 5 volts in order to connect either Vref or 0 volts to the bottom plate of selected capacitors 2-4 (and others). Therefore, the transistors making up all the conversion switches S5-S7 in the converter may be very fast, low voltage transistors, with a reliability voltage limit anywhere above Vref. Other types of conventional "low voltage" circuitry may be used to implement the conversion switches S5-S7. Conversion switches S5-S7 in FIG. 3 do not have a high-impedance (open) position, because the isolation switches 14-16 are used to disconnect the capacitors 2-4 from the conversion switches S5-S7 when the sampling switches S1-S3 are closed.

The converter may operate in the same way as the converter in FIG. 1 for converting a sampled value of the input voltage signal Vin to a corresponding digital code (with respect to Vref), except that the isolation switches 14-16 are open for any capacitor that is connected to Vin during the sampling operation, via a closed sampling switch S1-S3, and the isolation switches 14-16 are closed during the conversion operation when the sampling switches S1-S4 are open and the conversion switches S5-S7 are switched to apply Vref or 0 volts to their respective capacitor 2-4. During the conversion operation, the operation of the converter of FIG. 3 may be the same as the operation of the converter of FIG. 1. Since the voltage output by each of the conversion switches S5-S7 is substantially either Vref or 0 volts, there is a maximum voltage of Vref across the source/drain, gate/source, or gate/drain of the transistors 18 and 19 in each conversion switch S5-S7. The (potentially large) input voltage signal Vin that may be applied to the bottom plates of the capacitors 2-4 during the sampling operation is isolated from the conversion switches S5-S7 by the isolation switches 14-16.

If the converter of FIG. 3 is programmed to effectively attenuate and/or level shift the input voltage signal, so the full-scale input voltage range extends beyond the reference voltage range (from the low reference voltage potential to the high reference voltage potential), only some of the capacitors 2-4 are connected to Vin during the sampling operation, and other ones of the capacitors 2-4 are connected to either Vref or 0 volts during the sampling operation, as discussed previously and described in U.S. Pat. Nos. 6,940,445 and 4,641,130, incorporated herein by reference.

Similarly, if the converter of FIG. 3 is not programmable but hardwired to implement a specific full-scale input voltage range extending beyond the reference voltage range, some of the sampling switches S1-S3 may be eliminated along with the corresponding isolation switches 14-16 for those capacitors not used to sample the input voltage signal.

There may be any number of capacitors 2-4, depending on the desired resolution of the digital code being generated to represent the sampled voltage. In one embodiment, the converter of FIG. 3 is an 18 bit converter, having a capacitive D/A converter (CDAC) array equivalent to a binary-weighted CDAC array with 18 capacitors C17-C0 (of which only the 3 largest capacitors C17, C16, C15 are shown explicitly in FIG. 3 as capacitors 2,3,4). The converter is programmable for four different full-scale input voltage ranges. In the table below, Vref is set to 4.0625 volts (derived from a conventional bandgap reference voltage circuit, not shown), and the capacitors C17 through C10 sample the voltages identified in the table during the sampling operation. For example, for the ±5V full-scale input voltage range, C17 samples the high reference voltage potential, C16, C15, and C13 sample the input voltage signal Vin, and all the other capacitors C14, C12-C0 sample the low reference voltage potential. Those who are skilled in the art may derive the exact full-scale ranges that correspond to each mode of operation (each row in the table). Sampling the input voltage signal Vin on only some of the binary weighted capacitors and sampling a reference voltage potential on each of the other capacitors effectively attenuates the input voltage. A programmable offset is induced by selecting which reference potential each capacitor (not sampling the input voltage signal) is used to sample. The capacitors C9-C0 may all be connected to 0 volts during the sampling operation in the example below. Accordingly, capacitors C11-C0 sample only a reference voltage potential, and the conversion switches driving these capacitors need not be protected by an isolation switch.

The conversion process is the same as in the prior art, where the conversion switches S5-S7 (and others) switch the potential of the bottom plates of the eighteen capacitors C17-C0 between the two reference voltage potentials according to a series of comparison values provided via a successive-approximation register in the controller 17.

| Input Range | C17 | C16 | C15 | C14 | C13 | C12 | C11 | C10 |
|---|---|---|---|---|---|---|---|---|
| ±10 V | Vref | 0 V | Vin | Vin | 0 V | Vin | 0 V | 0 V |
| 0-10 V | 0 V | Vin | Vin | 0 V | Vin | 0 V | 0 V | 0 V |
| ±5 V | Vref | Vin | Vin | 0 V | Vin | 0 V | 0 V | 0 V |
| 0-5 V | Vin | Vin | 0 V | Vin | 0 V | 0 V | 0 V | 0 V |

In FIG. 3 the controller 17 controls the operation of the sampling switches S1-S4, isolation switches 14-16, and conversion switches S5-S7 based on a clock signal CLK. In one embodiment, firmware (a logic circuit) controls all the switches based on hardware logic clocked by the CLK signal. Such a logic circuit may be a state machine. Clocked logic for controlling the various switches is well known and does not need to be described.

The concept of isolating a low-voltage circuit (e.g., conversion switches) from a higher-voltage input signal during a sampling operation is applicable to various types of A/D converters, and signal processing circuits in general (including non-data-converters). For an A/D converter, there may be any number of capacitors, isolations switches, and conversion switches, depending on the resolution of the ADC.

Figure 2:
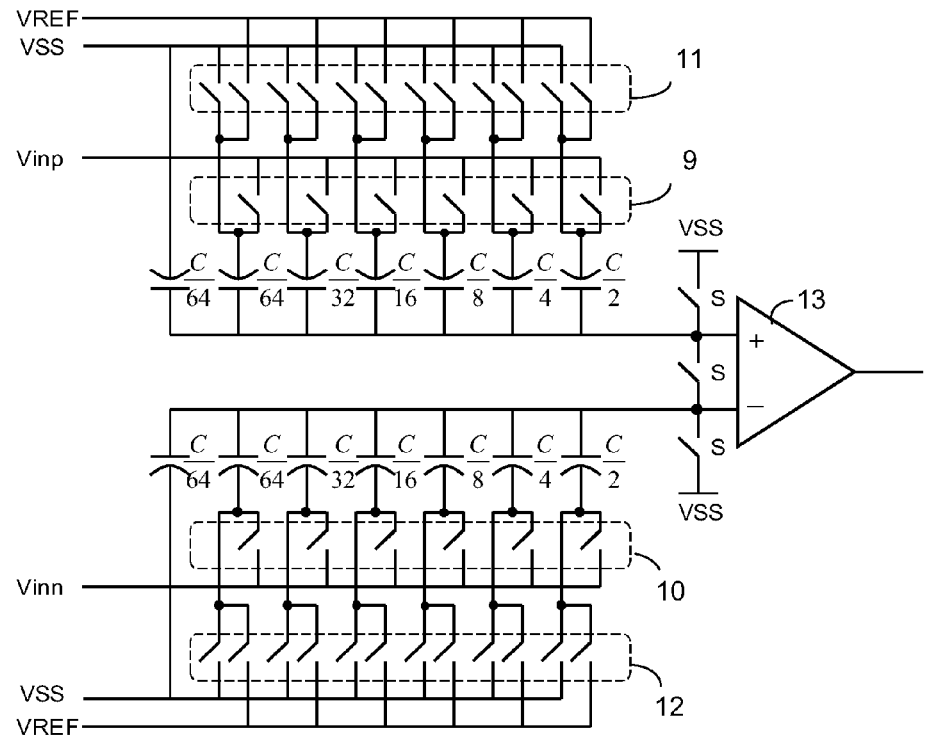
FIG. 2 illustrates a prior art differential SAR A/D converter.

For example, for the differential converter of FIG. 2, the isolation switches would be connected between the switches 11 and 9 and between the switches 12 and 10.

Although an exemplary A/D converter has been shown that successively compares a derived voltage to ground (a reference voltage potential) via a comparator, those skilled in the art will recognize that many structures, topologies, and variations may be used advantageously in combination with the present invention.

The isolation switches 14-16 need not be very fast since they only switch once for each sampled input signal. The sampling switches S1-S3 and isolation switches 14-16 can be any suitable type of high-voltage switches. Useful high-voltage switch structures include (but are not limited to): a single symmetrical high-voltage MOSFET; back-to-back asymmetrical MOSFETs of one polarity; transmission gate switches formed of high-voltage PMOS and NMOS transistors connected in parallel and controlled by complementary gate voltages, et cetera. Higher-voltage MOSFET devices may incorporate a gate-oxide that has a thickness exceeding the thickness of a gate-oxide used to implement the conversion switches S5-S7 (FIG. 3). Integrated circuits are implemented using a wide range of semiconductor technologies, and the most suitable way to implement a high-voltage isolation/sampling switch depends on the specifics of a selected semiconductor process.

Figure 4:
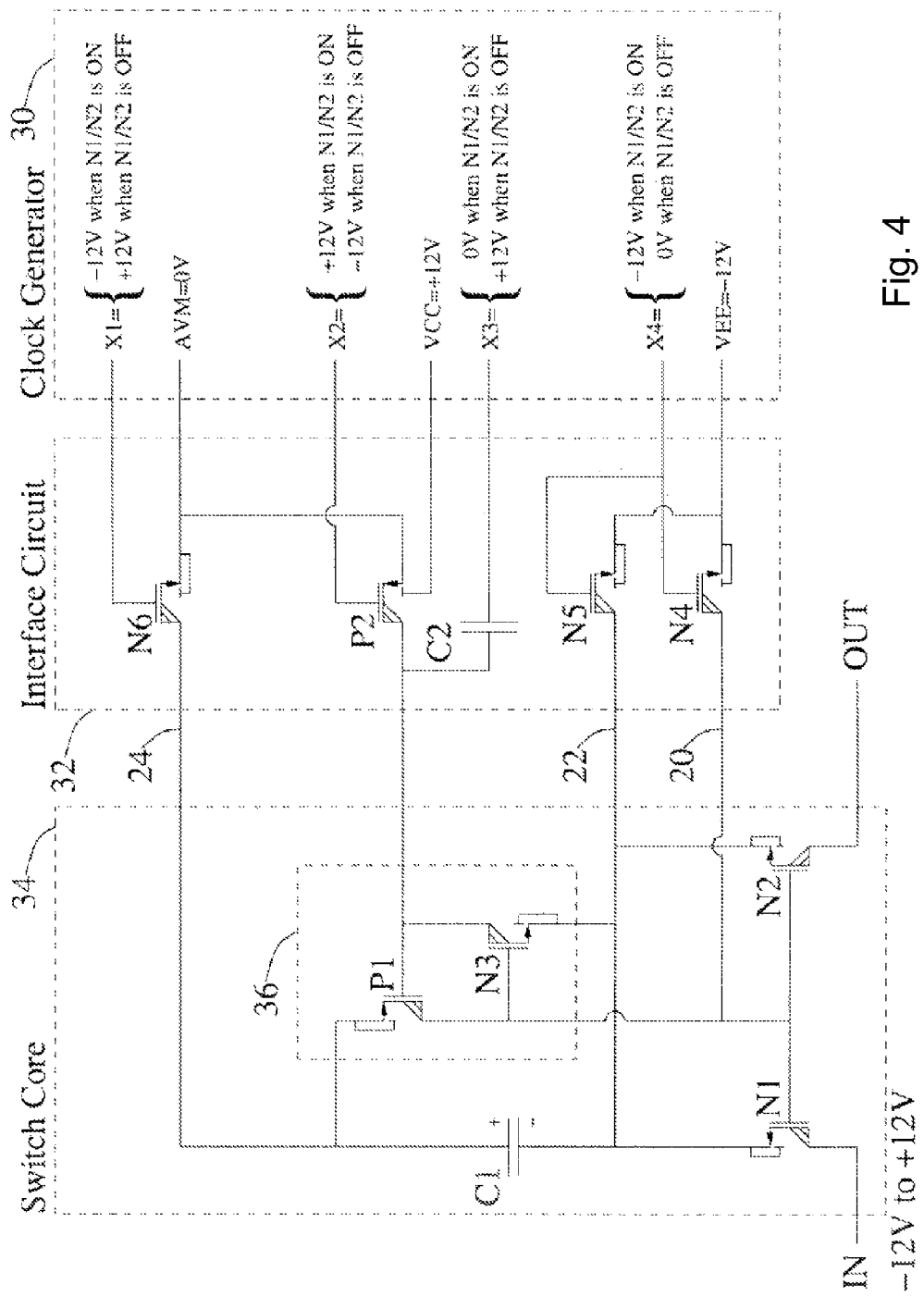
FIG. 4 illustrates one type of switching circuit that may be used as an isolation switching circuit in accordance with one embodiment of the invention.

FIG. 4 illustrates another examplary type of high-voltage switch suitable for the implementation of an isolation switch (14, 15, 16 in FIG. 3) and/or a sampling switch (S1-S3 in FIG. 3) comprising MOSFETs. The MOSFET switch of FIG. 4 is bootstrapped for limiting the gate-source voltage yet ensuring the switch turns on.

The switch itself is created using two NMOS transistors N1 and N2 connected back-to-back. The source terminals of N1 and N2 are connected together in a shared source node 22, and the gate terminals of N1 and N2 are connected together in a shared gate node 20. The drain terminal of N1 is first of two switch terminals, and the drain terminal of N2 is the second of the two switch terminals. When the switch is on, there is only a very small voltage drop between the two switch terminals (nominally zero, for zero current flowing through the switch devices N1 and N2).

In one embodiment, N1 and N2 are asymmetrical, allowing higher voltages to be applied across the drain-source and drain-gate terminals than a reliability voltage limit may allow for voltages applied across the gate-source terminals. This feature is conveyed in FIG. 4 by the cross-hatching at the drain side of the transistors. For example, the drain terminal may have a lightly doped drain extension. The drain extension may increase the drain-gate breakdown voltage considerably. Since the gate-source voltage for N1 and N2 is held below a predetermined maximum by the circuit, but the drain voltage is variable and potentially large, the gate-to-source breakdown voltage of N1 and N2 may not need to be as high as the drain-to-gate breakdown voltage.

Some examples of asymmetrical MOSFETs are described in U.S. Pat. Nos. 5,831,306 and 6,384,457, incorporated herein by reference. The use of asymmetrical transistors is optional. The use of silicon-on-insulator technologies may be advantageous to overcome limitations (including reliability voltage limits) associated with traditional junction-isolation used in many technologies.

In the example of FIG. 4, all transistors may tolerate at least 12V across any two terminals. The transistors may be vertical or lateral types. It is assumed that the range of input voltages applied to the IN terminal of the N1/N2 switch is −12 volts to +12 volts. The voltages and transistor limits are application specific.

In FIG. 4, a clock generator 30 and an interface circuit 32 control a switch core 34. The various transistors' body terminals are shown as being either connected to their source terminal or connected to a fixed bias voltage.

PMOS transistor P1 and NMOS transistor N3 implement a latching circuit 36.

The clock generator 30 provides control signals X1, X2, X3, and X4, which each toggle between two predetermined voltage levels. The voltage levels are shown in FIG. 4 where the "N1/N2 is OFF" levels identify the voltage levels the control signals have when the N1/N2 switch is off (i.e., not conductive). Likewise the "N1/N2 is ON" levels identify the voltage levels the control signals have when the N1/N2 switch is on (i.e., conductive). Various fixed power supply voltage levels (AVM, VCC, VEE) are also shown in FIG. 4.

When the N1/N2 switch is off, NMOS N6 provides a low-impedance connection between node 24 and AVM=0V, and NMOS N5 provides a low-impedance connection between node 22 and VEE=−12V. Accordingly, capacitor C1 is charged to AVM−VEE=+12V when the N1/N2 switch is off. Furthermore, NMOS N4 provides a low-impedance connection between node 20 and VEE=−12V, which ensures that the N1/N2 switch is substantially non-conductive with respect to the input voltage range from −12V to +12V. PMOS P2 provides a low-impedance connection between the gate terminal of PMOS P1 and AVM=0V, which ensures that P1 is off. The predetermined 0V and −12V voltage levels applied via low-impedance connections to each of the 4 circuit nodes within the switch core 34 will cause all MOSFETs (N1, N2, N3, and P1) in the switch core 34 to be substantially non-conductive. Accordingly, when the N1/N2 switch is off, the switch core 34 may consume very little static power, and capacitor C1 will be charged to +12V.

When the N1/N2 switch is to be closed (turned on), the clock generator 30 toggles control signals X1, X2, X3, and X4 to their "N1/N2 is ON" voltage levels. This will cause MOSFETs N4, N5, N6, and P2 to become substantially non-conductive, effectively isolating the switch core 34 from the driver circuit. A limited capacitive coupling C2 between the switch core 34 and the driver circuit is intentional and always present in this embodiment.

PMOS P1 and NMOS N3 form latching circuit 36, which provides a substantially conductive connection between node 24 and node 20 when the N1/N2 switch is on. When P1 is turned on, P1 connects capacitor C1 between the gate and source terminals of N3, whereby the bootstrap voltage across capacitor C1 will cause and maintain a substantially constant Vgs for N3, thus operating N3 as a bootstrapped switch. When N3 is turned on, N3 connects capacitor C1 across the source and gate terminals of P1, whereby the bootstrap voltage across capacitor C1 will cause and maintain a substantially constant Vgs for P1, thus operating P1 as a bootstrapped switch. The P1/N3 latching circuit 36 can be non-conductive (P1 and N3 both off) or conductive (P1 and N3 both on) while capacitor C1 is charged to the bootstrap voltage. The latching circuit 36 is non-conductive when the N1/N2 switch is off, and it is conductive when the N1/N2 switch is on. Capacitor C2 is used to trigger the P1/N3 latching circuit 36. A negative transition from +12V to 0V of control signal X3 in the transition from "N1/N2 is OFF" to "N1/N2 is ON" causes C2 to inject a negative charge pulse onto the gate of P1, which turns on P1, which then turns on N3. Capacitor C2 may be sized to control the amount of negative charge injected by the transition of control signal X3. Once the P1/N3 latching circuit 36 is triggered and made conductive, the effective bootstrap voltage across capacitor C1 will keep the P1/N3 latching circuit 36 in a latched conductive state until the driver circuit turns off the N1/N2 switch by toggling the X1, X2, X3, and X4 control signal to their "N1/N2 is OFF" voltage levels.

Various transistor-level implementations of the clock generator 30 may be used for providing the control signals X1, X2, X3, and X4 to the interface circuit 32. The design of a suitable clock generator 30 is well within the skills of those skilled in the art.

The present invention incorporating isolation switches can also be used in sampling and signal-processing circuits other than A/D converters, where the conductivity of an isolation switch is opposite to that of an input switch during sampling and signal-processing operations, and the input switch selectively couples an analog input signal to a capacitor.

Numerous variations of the invention are envisioned, and the embodiments described herein are merely examples of several preferred embodiments. The best choice of circuitry depends on the specific application, the available types of semiconductors, reliability voltage limits, silicon area, cost, and many other factors and considerations typically involved in the design of an integrated circuit. Accordingly, while particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:
1. An analog-to-digital converter comprising:
  a plurality of capacitors;
  a first sampling switch connected to selectively couple a first capacitor in the plurality of capacitors to an input voltage signal during a sampling operation;
  a plurality of conversion switches connected to selectively apply a plurality of reference voltage potentials to individual capacitors within the plurality of capacitors during a conversion operation;

a first isolation switch coupled between the first capacitor and a first conversion switch in the plurality of conversion switches; and a controller configured to control the first isolation switch such that the first conversion switch is substantially isolated from the input voltage signal during the sampling operation, the controller further configured to selectively control the plurality of conversion switches during the conversion operation to derive a digital code corresponding to a sampled value of the input voltage signal.

2. The analog-to-digital converter of claim 1 wherein a full-scale input voltage signal range exceeds a reference voltage range delimited by a first reference voltage potential and a second reference voltage potential.

3. The analog-to-digital converter of claim 1 further comprising:

a first plurality of sampling switches, including the first sampling switch, to selectively couple a first set of capacitors in the plurality of capacitors, including the first capacitor, to the input voltage signal during the sampling operation;

a first plurality of isolation switches, including the first isolation switch, coupled between the first set of capacitors in the plurality of capacitors and the plurality of conversion switches;

wherein the controller is configured to control the first plurality of isolation switches such that the conversion switches are substantially isolated from the input voltage signal during the sampling operation.

4. The analog-to-digital converter of claim 1 wherein the first conversion switch has a reliability voltage limit that is less than a width of a full-scale range of the analog-to-digital converter.

5. The analog-to-digital converter of claim 1 wherein the first isolation switch is substantially conductive throughout the conversion operation.

6. The analog-to-digital converter of claim 1 wherein the digital code is derived using a successive-approximation algorithm.

7. The analog-to-digital converter of claim 1 wherein the first sampling switch has at least two terminals, wherein a terminal-to-terminal voltage for the first sampling switch is substantially non-zero and independent of the input voltage signal during the sampling operation.

8. The analog-to-digital converter of claim 1 wherein the first sampling switch is a bootstrapped switch.

9. The analog-to-digital converter of claim 1 wherein the first sampling switch comprises an asymmetrical transistor device.

10. The analog-to-digital converter of claim 1 wherein the first isolation switch is a bootstrapped switch.

11. The analog-to-digital converter of claim 10 wherein the first isolation switch comprises an asymmetrical transistor device.

12. The analog-to-digital converter of claim 1 wherein the first sampling switch comprises a transistor device having a first gate oxide thickness, and the plurality of conversion switches comprises transistors having a gate oxide that is substantially thinner than the first gate oxide thickness.

13. The analog-to-digital converter of claim 12 wherein the first isolation switch comprises a transistor device having substantially the first gate oxide thickness.

14. A signal-processing circuit receiving an analog input signal within a full-scale input voltage range characterized by a lower input voltage limit and an upper input voltage limit, the signal-processing circuit comprising:

a first circuit that processes signals only within a first voltage range that is substantially less wide than the full-scale input voltage range;

a capacitor having a first capacitor terminal and a second capacitor terminal;

an input switch selectively coupling the analog input signal to the first capacitor terminal; and an isolation switch selectively coupling the first circuit to the first capacitor terminal, wherein the input switch is substantially conductive and the isolation switch is substantially non-conductive during a sampling operation, and the isolation switch is substantially conductive and the input switch is substantially non-conductive during a signal-processing operation.

15. The signal-processing circuit of claim 14 wherein the first circuit is used to derive a numerical representation of a sampled value of the analog input signal.

16. The signal-processing circuit of claim 14 wherein the analog input signal is selectively connectable to a plurality of subsets of a plurality of input capacitors, whereby any of a plurality of full-scale input voltage ranges is selectable.

17. The signal-processing circuit of claim 16, wherein the full-scale input voltage range is programmable.

18. The signal-processing circuit of claim 14 wherein the first terminal of the first capacitor is switched selectively between a first reference potential and a second reference potential during the signal-processing operation.

19. The signal-processing circuit of claim 14 wherein the input switch comprises an asymmetrical transistor device.

20. The signal-processing circuit of claim 19 wherein the input switch is a bootstrapped switch.

* * * * *